United States Patent
Hawks et al.

(10) Patent No.: US 6,903,270 B1
(45) Date of Patent: Jun. 7, 2005

(54) METHOD AND STRUCTURE FOR SECURING A MOLD COMPOUND TO A PRINTED CIRCUIT BOARD

(75) Inventors: Doug A. Hawks, Escondido, CA (US); Mark A. Kuhlman, Laguna Niguel, CA (US); Kevin J. Cote, Rancho Santa Margarita, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 09/638,172

(22) Filed: Aug. 11, 2000

(51) Int. Cl.[7] .............................. H05K 5/06; H01L 23/28
(52) U.S. Cl. ..................... 174/52.2; 257/788; 257/793
(58) Field of Search .............................. 174/52.2, 52.4; 257/788, 793, 712, 713, 717

(56) References Cited

U.S. PATENT DOCUMENTS

| | | | | |
|---|---|---|---|---|
| 5,355,283 A | * | 10/1994 | Marrs et al. | 361/760 |
| 5,612,576 A | * | 3/1997 | Wilson et al. | 257/788 |
| 5,825,628 A | * | 10/1998 | Garbelli et al. | 361/763 |
| 6,014,318 A | * | 1/2000 | Takeda | 361/764 |
| 6,107,679 A | * | 8/2000 | Noguchi | 257/678 |
| 6,392,294 B1 | * | 5/2002 | Yamaguchi | 257/690 |

* cited by examiner

*Primary Examiner*—Hung V. Ngo
(74) *Attorney, Agent, or Firm*—Farjami & Farjami LLP

(57) ABSTRACT

Method and structure for securing a mold compound to a printed circuit board is disclosed. A through hole or a blind hole is fabricated in a printed circuit board adjacent to a die. The hole is then filled with a mold compound. The mold compound also surrounds and covers the die. The mold compound within the hole locks the mold compound to the surface of the printed circuit board. In one embodiment, a through hole or a blind hole is fabricated adjacent to a semiconductor die. The semiconductor die is attached to a layer of gold-plated copper on the printed circuit board. After the semiconductor die is attached to the layer of gold-plated copper on the printed circuit board, the semiconductor die is surrounded and covered by the mold compound and the fabricated hole is filled with the mold compound. The mold compound within the hole has good adhesion to the resin layer which constitutes the printed circuit board. This adhesion locks the mold compound securely to the surface of the printed circuit board.

16 Claims, 2 Drawing Sheets

US 6,903,270 B1

METHOD AND STRUCTURE FOR SECURING A MOLD COMPOUND TO A PRINTED CIRCUIT BOARD

BACKGROUND OF THE INVENTION

1. Field of the Invention

The present invention is generally in the field of printed circuit board packaging. More specifically, the invention is in the field of plastic laminate-based molded integrated circuit ("IC") packages.

2. Background Art

It is known in the field of plastic laminate-based printed circuit board packaging that plastic laminate-based molded IC packages such as plastic ball grid arrays and multi-chip modules are prone to reliability problems. Electrical failures such as shorts and opens occur in the substrates and at the wire bonds as a result of cracking that occurs in the die attach material used to attach a semiconductor die to the printed circuit board.

These cracks may then propagate into the interface between the mold compound and the laminate material and/or into the mold compound that surrounds the perimeter of the semiconductor die. This cracking is generally referred to as "delamination." As a result of the temperature changes inherent to the IC package's normal operation, delamination will worsen during the life of the IC package. Thus, over the long term, the failure rate of these IC packages will increase.

One of the main reasons for delamination is the presence of moisture within the mold compound, the resin layers of the printed circuit board, and the die attach material. Such moisture may result from the IC package being subjected to a humid environment.

During subsequent manufacturing processes the printed circuit board may be subjected to heat. For example, during soldering operations the IC package may enter a re-flow furnace where the temperature is well above the boiling point for water. This heat causes the moisture in the die-attachment area ("die-attach area") to vaporize. This vapor results in upward force in any pockets or voids that may be present underneath the die-attach area. The vapor is unable to pass through the semiconductor die.

Thus, the semiconductor die acts as a barrier to the vapor and there is an upward force on the semiconductor die from the vapor trying to escape into the surrounding environment. This force may cause a separation between the semiconductor die and the die attach material bonding the semiconductor die to the surface of the printed circuit board. In other cases, the semiconductor die will remain attached to the die-attach area but the mold compound will separate from the metal surface as a result of upward force from the vapor.

FIG. 1 shows a cross section of plastic laminate-based molded printed circuit board package 10 after semiconductor die 16 has separated from die-attach area 18. The printed circuit board comprises a layer of solder mask, referred to by numeral 26. A first layer of metal, referred to by numeral 22, rests on top of solder mask 26. A layer of resin, referred to by numeral 24, rests on top of metal 22. A second layer of metal, referred to by numeral 36, rests on top of resin 24. Solder mask 38 covers a portion of metal 36, but does not cover the top area of metal 36 referred to by numeral 40, which is a printed circuit board bonding region. Printed circuit board bonding region 40 is a designated region on the surface of metal 36 used for bonding to bond wires.

Before separation, semiconductor die 16 was attached to die-attach area 18 by die attach material 48, also referred to as die attach 48. Die attach area 18 usually comprises die attach 48 resting on a layer of solder mask which is not shown in any of the Figures in the present application. A bond wire, referred to by numeral 28, is bonded to a die bonding pad, referred to by numeral 14, that rests on top of semiconductor die 16. Bond wire 28 is gold or aluminum. Before separation, the other end of bond wire 28 was bonded to a printed circuit board bonding location referred to by numeral 30, which is located in printed circuit board bonding region 40. Before separation, the mold compound, referred to by numeral 12, completely enclosed metal 36, solder mask 38, semiconductor die 16, bond wire 28, die bonding pad 14 and printed circuit board bonding location 30.

As the printed circuit board is heated, the vapor, referred to generally by numeral 32, results in an upward force, shown as arrows and generally referred to by numeral 34. This upward force, in turn, results in delamination in die-attach 48 and a resulting separation between semiconductor die 16 and die-attach area 18. Semiconductor die 16 in turn forces mold compound 12 to separate from metal 36. Bond wire 28 is detached from printed circuit board bonding location 30 as a result of mold compound 12 separating from metal 36. This results in an electrical open and consequent failure of the circuit.

Mold compounds adhere poorly to the smooth surface of gold. Thus, when metal 36 is gold-plated copper, the delamination problem discussed above is exacerbated by the poor adhesion properties between metal 36 and mold compound 12. As a result of the poor adhesion between mold compound 12 and metal 36, mold compound 12 cannot prevent the separation of semiconductor die 16 from die-attach area 18. Instead, mold compound 12 separates from metal 36 along with semiconductor die 16, as discussed above.

As a result of the problem illustrated by FIG. 1 and discussed above, efforts have been made to improve the strength of the materials used to secure components to the surface of the printed circuit board. In addition, efforts have been made to reduce the moisture absorption properties of mold compounds and die attach materials. Also, there have been efforts to increase the chemical adhesion properties between the mold compounds and metals used in the manufacture of laminate-based molded IC packages.

Because the methods discussed above have not eliminated the delamination problem, efforts have been made to reduce the amount of exposed metal on the surface of the printed circuit board whenever possible. This area can be reduced, for example, by being covered with solder mask 38, since mold compounds adhere better to solder mask than to the exposed metal. Thus, when adhering to solder mask 38, mold compound 12 more effectively hinders the separation of semiconductor die 16 from the surface of the printed circuit board by itself adhering more securely to solder mask 38.

However, in some applications, for example, circuits using Radio Frequency (RF) signals, design engineers require a relatively large area of exposed metal on the surface of the printed circuit board to increase the electrical performance of the circuit. Since this area of exposed metal is very large, it is not desirable to cover it with solder mask. Therefore, the solder mask method discussed above cannot be used effectively.

Thus, there is a need in the art for a cost-effective method to more effectively secure a mold compound on the surface of the printed circuit board.

SUMMARY OF THE INVENTION

The present invention is method and structure for securing a mold compound to a printed circuit board. According to the invention, a through hole or a blind hole is fabricated in a printed circuit board adjacent to a die. The hole is then filled with a mold compound. The mold compound also surrounds and covers the die. The mold compound within the hole locks the mold compound to the surface of the printed circuit board.

In one embodiment, a through hole or a blind hole is fabricated adjacent to a semiconductor die. The semiconductor die is attached to a layer of gold-plated copper on the printed circuit board. After the semiconductor die is attached to the layer of gold-plated copper on the printed circuit board, the semiconductor die is surrounded and covered by the mold compound and the fabricated hole is filled with the mold compound. The mold compound within the hole has good adhesion to the resin layer which constitutes the printed circuit board. This adhesion locks the mold compound securely to the surface of the printed circuit board.

DETAILED DESCRIPTION OF THE INVENTION

The present invention is method and structure for securing a mold compound to a printed circuit board. The following description contains specific information pertaining to different types of materials, layouts, dimensions, and implementations of the invention. One skilled in the art will recognize that the present invention may be practiced with material, layouts, dimensions, and implementations different from those specifically discussed in the present application. Moreover, some of the specific details of the invention are not discussed in order to not obscure the invention. The specific details not discussed in the present application are within the knowledge of a person of ordinary skills in the art.

The drawings in the present application and their accompanying detailed description are directed to merely example embodiments of the invention. To maintain brevity, other embodiments of the invention which use the principles of the present invention are not specifically described in the present application and are not specifically illustrated by the present drawings.

Figure 1:
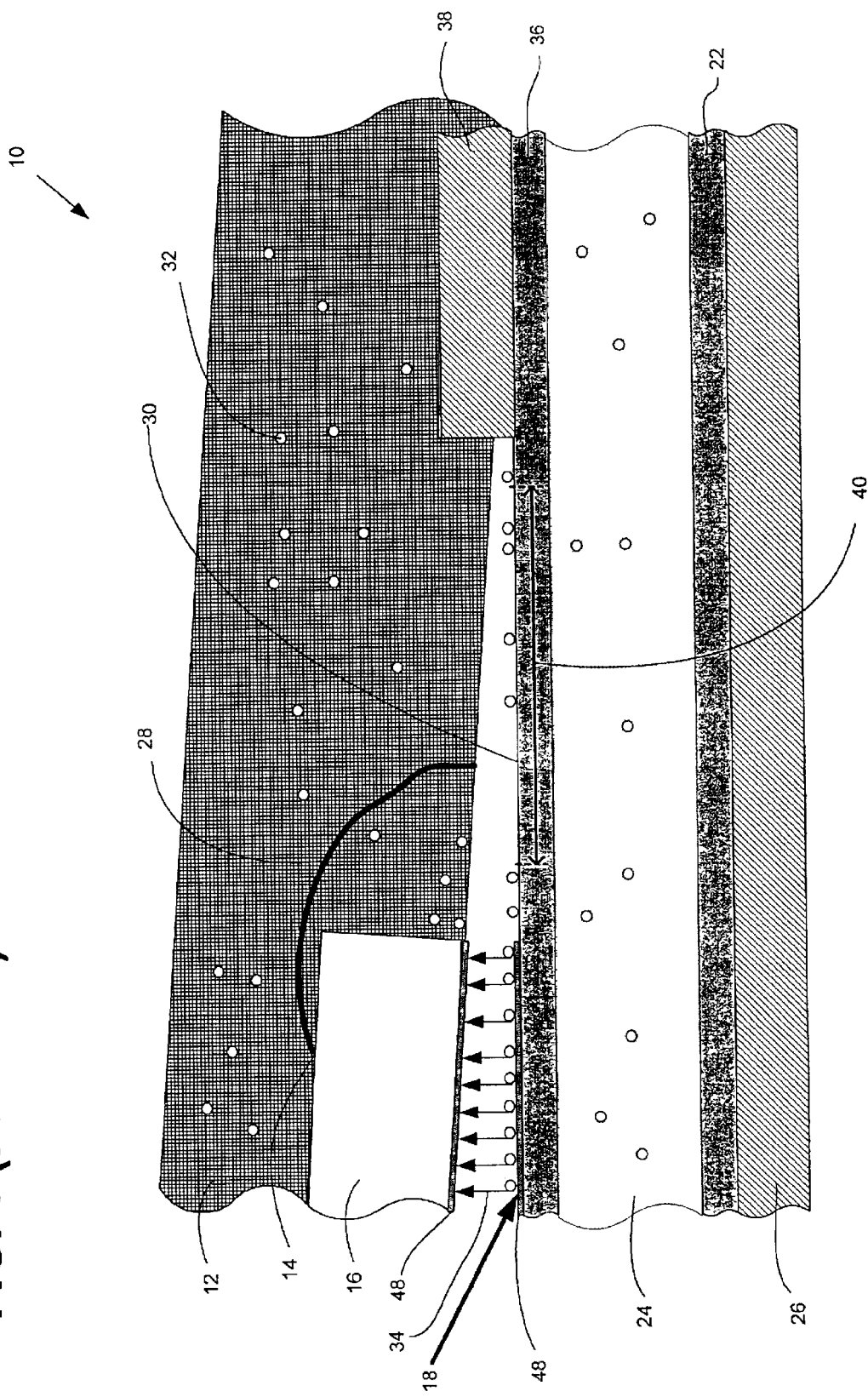
FIG. 1 illustrates a printed circuit board and die arrangement showing separation of the die and mold compound from the metal surface of the printed circuit board.
Figure 2:
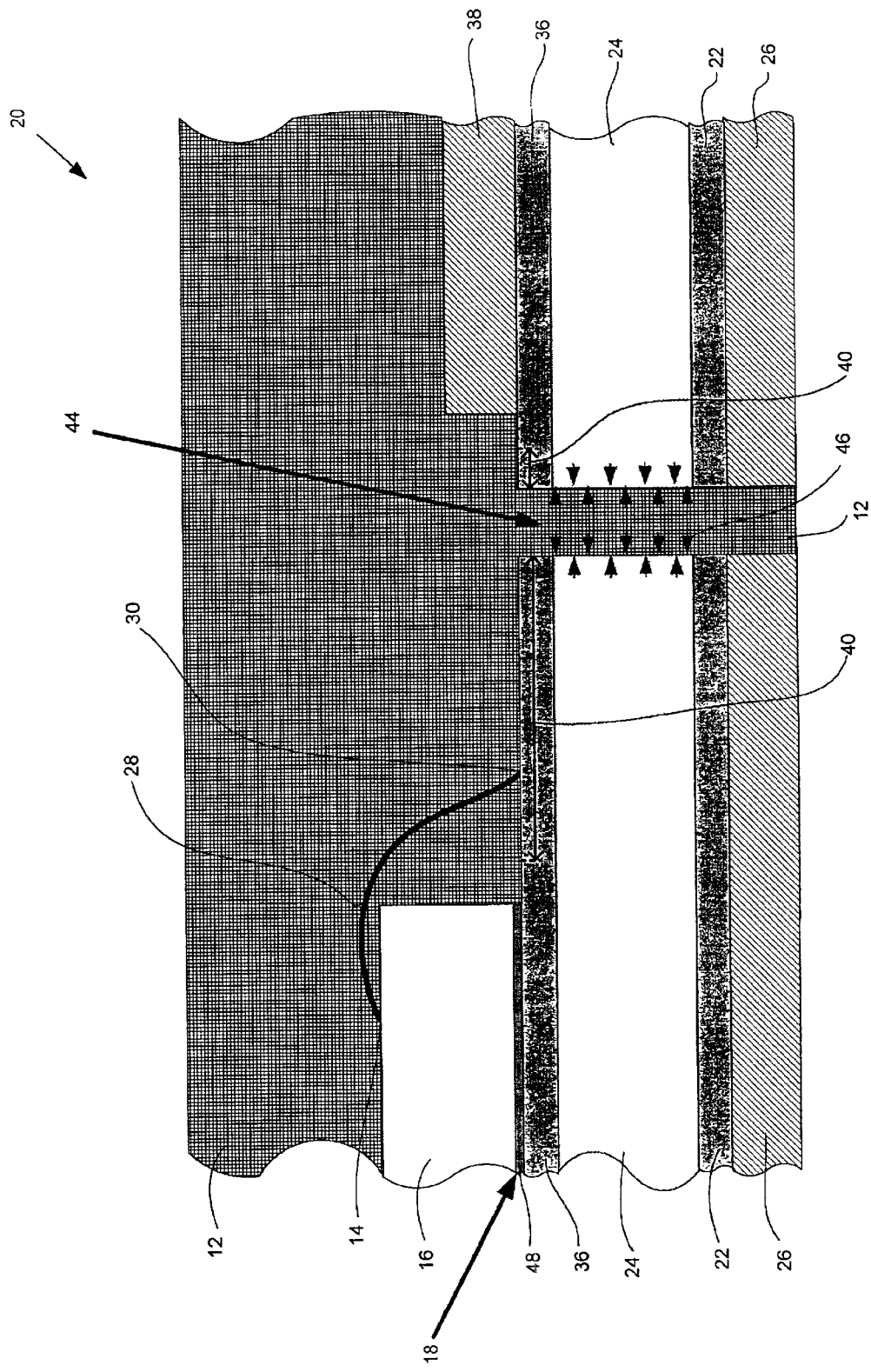
FIG. 2 illustrates a printed circuit board and die arrangement showing a fabricated hole filled with mold compound where the mold compound also surrounds and covers the die.

FIG. 2 shows a cross section of one example of the invention. Plastic laminate-based molded printed circuit board package 20 comprises a layer of solder mask, referred to by numeral 26. A first layer of metal, referred to by numeral 22, rests on top of solder mask 26. A layer of resin, referred to by numeral 24, rests on top of metal 22. A second layer of metal, referred to by numeral 36, rests on top of resin 24. In the present example, metal 36 can be gold-plated copper.

Semiconductor die 16 is attached to die-attach area 18 by die attach 48. In the present embodiment, die attach area 18 includes a layer of solder mask (not shown in any of the Figures) under die attach 48. Die attach 48 can comprise silver-filled epoxy or bismalemide. Generally die attach 48 can be electrically conductive or electrically insulative, thermoset adhesive or thermoplastic adhesive, or a combination thereof. A bond wire, referred to by numeral 28, is bonded to a die bonding pad, referred to by numeral 14, that rests on top of semiconductor die 16. The other end of bond wire 28 is bonded to a printed circuit board bonding location, referred to by numeral 30 which is located in printed circuit board bonding region 40. Printed circuit board bonding region 40 is a designated region on the surface of metal 36 used for bonding to bond wires such as bond wire 28. Solder mask 38 covers a portion of metal 36, but does not cover printed circuit board bonding region 40. In one embodiment, printed circuit board region 40 comprises a layer of nickel plating on metal 36 followed by a layer of gold plating on top of the nickel plated metal 36. Alternatively, a palladium plating could be used instead of the gold/nickel plating described above. The mold compound, referred to by numeral 12, completely encloses metal 36, solder mask 38, semiconductor die 16, bond wire 28, die bonding pad 14 and printed circuit board bonding location 30.

Die-attach 48 is applied to die attach area 18 to create a strong mechanical bond between semiconductor die 16 and the printed circuit board. This bond should not become loose or deteriorate in the manufacturing process or during use by the customer. Mold compound 12 surrounds plastic laminate-based molded printed circuit board package 20 to provide protection from contamination and physical abuse in subsequent manufacturing processes and during use by the customer. In the present example, mold compound 12 can be made of various chemical compounds such as multifunctional epoxy, novolac, and biphenyl resin, or a combination thereof.

In this example, printed circuit board bonding region 40 can be gold/nickel plated copper or palladium plated copper. Mold compound 12 does not adhere well to gold or palladium. Therefore, as discussed above, a method is needed to secure mold compound 12 to metal 36.

FIG. 2 also shows a cross section of a standard hole, referred to by numeral 44, which has been fabricated in the laminate printed circuit board adjacent to semiconductor die 16. Hole 44 may be fabricated by drilling. Alternatively, hole 44 can be punched into the laminate printed circuit board, or may be fabricated through other means, such as by plasma etching or laser. In addition, although hole 44 is shown in FIG. 2 as a "through hole," i.e. extending through the entire printed circuit board, hole 44 could also be fabricated as a partial or "blind" hole, i.e. a hole that extends only a certain depth into the printed circuit board. The invention uses hole 44 to provide more effective mechanical and chemical adhesion between mold compound 12 and metal 36. The invention achieves this result by fabricating hole 44 prior to the application of mold compound 12. In the present example, the diameter of hole 44 can be 0.254 millimeters. The invention's hole 44 remains unplated. Instead, mold compound 12 is applied to and completely fills hole 44 during the molding process, as described in more detail below.

During the process where mold compound 12 is applied to the printed circuit board, the printed circuit board's bottom rests on a plate within a mold mounted in a transfer molding machine. Thus, in the case of a through hole, the plate (not shown in FIG. 2) sits at the bottom of hole 44. Mold compound 12 is in a high temperature liquid state when it is applied to the printed circuit board and is forced around semiconductor die 16, die bonding pad 14, printed circuit board bonding location 30, bond wire 28 and solder mask 38. Mold compound 12 is also forced into hole 44 and fills it up. In the case of a through hole, mold compound 12 is flattened against the plate at the bottom of hole 44. Most of the air is displaced from hole 44 as it is filled up. Mold compound 12 is then allowed to set, i.e., change from a liquid to a solid state as the temperature goes down.

Thus, during the molding process, hole 44 is completely filled with mold compound 12 and, in the case of a through hole, the flow of mold compound 12 out of hole 44 is limited by the placement of a plate (not shown in FIG. 2) at the bottom of the printed circuit board. In addition, semiconductor die 16 is surrounded and covered by mold compound 12. The result of this process is shown in FIG. 2 where hole 44 is shown completely filled with mold compound 12.

Resin 24 and mold compound 12 have similar chemical properties. Thus, there is a strong chemical bond between them. In addition, resin 24 and mold compound 12 have similar physical properties. They both have relatively rough surfaces. As a result, a tooth like structure with interlocking cracks and crevices is formed where resin 24 and mold compound 12 meet along the walls of hole 44. These interlocking cracks and crevices result in a strong mechanical bond between mold compound 12 and resin 24 where they meet in hole 44. In addition, the walls of hole 44 provide an increased surface area on which mold compound 12 can adhere. This increase in the surface area where adhesion takes place results in a stronger overall adhesion of mold compound 12 to the surface of plastic laminate-based molded printed circuit board package 20. The arrows in FIG. 2, generally referred to by numeral 46, show the bonding between resin 24 and mold compound 12 in hole 44.

This chemical and mechanical bond between resin 24 and mold compound 12 essentially "stakes down" mold compound 12 to the surface of metal 36 and to the top of semiconductor die 16, thus providing better protection against separation of semiconductor die 16 from die attach area 18 or mold compound 12 from metal 36. Thus, when vapor resulting from heat causes an upward force on semiconductor die 16 and mold compound 12, the portion of mold compound 12 in hole 44 acts as a plug and locks mold compound 12 into the printed circuit board.

In this way, the invention provides significantly better mechanical and chemical adhesion between mold compound 12 and metal 36. This, in turn, allows mold compound 12 to provide better protection against separation of semiconductor die 16 from die-attach area 18. Therefore, the reliability of the plastic laminate-based molded IC package will be substantially increased.

The invention's method is very cost-effective since the equipment used to fabricate the invention is already a part of the standard laminate printed circuit board manufacturing process. Thus, the invention provides, in a cost effective manner, significantly better protection against electrical failures such as shorts and opens that occur in the substrates and at the wire bonds as a result of delamination.

From the above description of the invention it is manifest that various techniques can be used for implementing the concepts of the present invention without departing from its scope. Moreover, while the invention has been described with specific reference to certain embodiments, a person of ordinary skills in the art would recognize that changes can be made in form and detail without departing from the spirit and the scope of the invention. Thus, the described embodiments are to be considered in all respects as illustrative and not restrictive. It should also be understood that the invention is not limited to the particular embodiments described herein, but is capable of many rearrangements, modifications, and substitutions without departing from the scope of the invention.

Thus, method and structure for securing a mold compound to a printed circuit board have been described.

What is claimed is:

1. A structure comprising:
   a printed circuit board including a die attached to a top surface of said printed circuit board;
   said printed circuit board comprising a first layer of metal on a bottom surface of said printed circuit board;
   said printed circuit board further comprising a second layer of metal on said top surface of said printed circuit board, wherein said second layer of metal is situated below said die;
   a blind hole extending through said second layer of metal of said printed circuit board, said blind hole being adjacent to said die, said blind hole being filled with a mold compound, said blind hole being unplated, said mold compound surrounding and covering said die, wherein said mold compound is locked into said second layer of metal of said printed circuit board;
   wherein said printed circuit board further comprises a layer of resin between said first and second layers of metal, wherein said blind hole extends through said layer of resin to form a structure with interlocking cracks and crevices within said layer of resin.

2. The structure of claim 1 further comprising a bond wire, wherein a first end of said bond wire is bonded to a die bonding pad on said die and a second end of said bond wire is bonded to a printed circuit board bonding location on said printed circuit board.

3. The structure of claim 1 wherein said mold compound is selected from the group consisting of multifunctional epoxy, novolac, and biphenyl resin.

4. The structure of claim 1 further comprising a layer of die attach between said die and said printed circuit board.

5. The structure of claim 1 further comprising a layer of die attach between said die and said second layer of metal.

6. The structure of claim 1 wherein said second layer of metal comprises gold-plated copper.

7. A structure comprising:
   a printed circuit board including a die attached to a top surface of said printed circuit board;
   said printed circuit board comprising a first layer of metal on a bottom surface of said printed circuit board;
   said printed circuit board further comprising a second layer of metal on said top surface of said printed circuit board, wherein said second layer of metal is situated below said die;
   a first portion of a mold compound surrounding and covering said die, said mold compound being selected from the group consisting of multifunctional epoxy, novolac, and biphenyl resin;
   a through hole traversing said first and second layers of metal of said printed circuit board, said through hole being adjacent to said die, said through hole being completely filled with a second portion of said mold compound said through hole being unplated, wherein said second portion of said mold compound in said through hole locks said first portion of said mold compound into said printed circuit board;
   wherein said printed circuit board further comprises a layer of resin between said first and second layers of metal, wherein said through hole extends through said layer of resin to form a structure with interlocking cracks and crevices within said layer of resin.

8. The structure of claim 7 further comprising a bond wire, wherein a first end of said bond wire is bonded to a die bonding pad on said die and a second end of said bond wire is bonded to a printed circuit board bonding location on said printed circuit board.

9. The structure of claim 7 further comprising a layer of die attach between said die and said printed circuit board.

10. The structure of claim 7 further comprising a layer of die attach between said die and said second layer of metal.

11. The structure of claim 7 wherein said second layer of metal comprises gold-plated copper.

12. A plastic laminate-based molded printed circuit board package comprising:
- a printed circuit board including a semiconductor die attached to a top surface of said printed circuit board;
- said printed circuit board comprising a first layer of metal on a bottom surface of said printed circuit board;
- said printed circuit board further comprising a second layer of metal on said top surface of said printed circuit board, wherein said second layer of metal is situated below said die;
- a first portion of a mold compound surrounding and covering said semiconductor die, said mold compound being selected from the group consisting of multifunctional epoxy, novolac, and biphenyl resin;
- a through hole traversing said first and second layers of metal of said printed circuit board, said through hole being adjacent to said semiconductor die, said through hole being completely filled with a second portion of said mold compound said through hole being unplated, wherein said second portion of said mold compound in said through hole locks said first portion of said mold compound into said printed circuit board;
- wherein said printed circuit board further comprises a layer of resin between said first and second layers of metal, wherein said through hole extends through said layer of resin to form a structure with interlocking cracks and crevices within said layer of resin.

13. The structure of claim 12 further comprising a bond wire, wherein a first end of said bond wire is bonded to a semiconductor die bonding pad on said semiconductor die and a second end of said bond wire is bonded to a printed circuit board bonding location on said printed circuit board.

14. The structure of claim 12 further comprising a layer of die attach between said semiconductor die and said printed circuit board.

15. The structure of claim 12 further comprising a layer of die attach between said die and said second layer of metal.

16. The structure of claim 12 wherein said second layer of metal comprises gold-plated copper.

* * * * *